(12) United States Patent
Kikuchi et al.

(10) Patent No.: US 8,294,759 B2
(45) Date of Patent: Oct. 23, 2012

(54) CALIBRATION METHOD OF ELECTRONIC DEVICE TEST APPARATUS

(75) Inventors: Aritomo Kikuchi, Tokyo (JP); Hiroto Nakamura, Tokyo (JP); Jinji Tokita, Tokyo (JP); Katsuhiko Ikeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 951 days.

(21) Appl. No.: 12/305,075

(22) PCT Filed: Dec. 11, 2006

(86) PCT No.: PCT/JP2006/324697
§ 371 (c)(1),
(2), (4) Date: Dec. 16, 2008

(87) PCT Pub. No.: WO2007/148422
PCT Pub. Date: Dec. 27, 2007

(65) Prior Publication Data
US 2009/0278926 A1 Nov. 12, 2009

(30) Foreign Application Priority Data
Jun. 19, 2006 (WO) .................. PCT/JP2006/312255

(51) Int. Cl.
*H04N 7/18* (2006.01)
*H04N 9/47* (2006.01)
(52) U.S. Cl. ............................. 348/87; 348/94; 348/95
(58) Field of Classification Search ............. 348/87, 348/94, 95
See application file for complete search history.

(56) References Cited

U.S. PATENT DOCUMENTS
6,445,201 B1* 9/2002 Simizu et al. ............ 324/750.02
7,555,157 B2* 6/2009 Davidson et al. ............ 382/154

FOREIGN PATENT DOCUMENTS
JP 2001-051018 A 2/2001
JP 2003-287561 A 10/2003
WO 03/075023 A1 9/2003

OTHER PUBLICATIONS

English language Abstract and translation of JP 2003-287561 A (Oct. 10, 2003).
English language Abstract and translation of JP 2001-051018 A (Feb. 23, 2001).

* cited by examiner

*Primary Examiner* — Kristie Shingles
(74) *Attorney, Agent, or Firm* — Greenblum & Bernstein P.L.C.

(57) ABSTRACT

In an electronic device test apparatus using image processing technology to position an IC device relative to a socket, a calibration method of an electronic device test apparatus of calibrating a relative position of a device camera with respect to a socket, the method comprising: calculating an offset amount of a socket guide with respect to the socket on the basis of a relative position of the socket camera with respect to the socket guide and a relative position of a socket camera with respect to the socket; and adding this offset amount to the relative position of the device camera with respect to the socket guide so as to calculate the relative position of the device camera with respect to the socket.

18 Claims, 16 Drawing Sheets

CALIBRATION METHOD OF ELECTRONIC DEVICE TEST APPARATUS

TECHNICAL FIELD

The present invention relates to a calibration method of calibrating a relative position of an image capturing means with respect to a socket after changing the type of IC devices etc. in an electronic device test apparatus using a CCD camera or other image capturing means to position a semiconductor integrated circuit device or other various electronic devices (below also called "IC devices" representatively) relative to a socket with a high precision for testing.

BACKGROUND ART

An electronic device test apparatus called a "handler" conveys a large number of IC devices housed on a tray into the handler, brings the IC devices into electrical contact with a test head, and uses the main unit of the electronic device test apparatus (hereinafter also referred to as a "tester") to run tests. Further, when the tests end, it ejects the tested IC devices from the test head and reloads them on trays in accordance with the test results so as to sort them into categories such as good devices and defective devices.

Among such handlers, it has been known in the past to prevent miscontact between IC devices and sockets by using image processing technology to position the IC devices relative to the sockets with a high precision before bringing them into contact with the sockets (for example, see Patent Document 1).

Usually, the sockets on a test head are fabricated in accordance with the types of the IC devices, so each time the type of the IC devices are changed, the sockets are changed to other sockets tailored to those devices. For this reason, handlers using image processing technology has to be calibrated in positions of CCD cameras with respect to sockets after the change (for example, see Patent Document 2).
Patent Document 1: International Publication No. 03/075023
Patent Document 2: Japanese Patent Publication (A) No. 2001-51018

DISCLOSURE OF THE INVENTION

An object of the present invention is to provide a calibration method of an electronic device test apparatus enabling a relative position of an image capturing means with respect to a socket to be calibrated with a high precision.

(1) To achieve this object, according to the present invention, there is provided a calibration method of calibrating a relative position of a device image capturing means with respect to a socket in an electronic device test apparatus comprising: a socket image capturing means for capturing an image of a socket; and a device image capturing means for capturing an image of a device under test, wherein an alignment means to positions the device under test relative to the socket, then using a moving means brings the device under test into electrically contact with the socket so as to test the device under test, the calibration method comprising: a placement step of placing a jig at a first predetermined position; a first image capturing step of capturing an image of the jig placed at the first predetermined position by the socket image capturing means; a first movement step of moving the jig placed at the first predetermined position to the alignment means by the moving means; a second image capturing step of capturing an image of the jig positioned at the alignment means by the device image capturing means; a third image capturing step of capturing an image of the socket by the socket image capturing means; a first recognition step of recognizing a relative position of the socket image capturing means with respect to the first predetermined position on the basis of the image information captured in the first image capturing step; a second recognition step of recognizing a relative position of the device image capturing means with respect to the first predetermined position on the basis of the image information captured in the second image capturing step; a third recognition step of recognizing a relative position of the socket image capturing means with respect to the socket on the basis of the image information captured in the third image capturing step; a first calculation step of calculating a relative offset amount of the first predetermined position with respect to the socket on the basis of the relative position of the socket image capturing means with respect to the first predetermined position recognized in the first recognition step and the relative position of the socket image capturing means with respect to the socket recognized in the third recognition step; and a second calculation step of calculating a relative position of the device image capturing means with respect to the socket on the basis of the relative position of the device image capturing means with respect to the first predetermined position recognized in the second recognition step and the offset amount calculated in the first calculation step (see claim 1).

The present invention calculates the offset amount of the first predetermined position with respect to the socket on the basis of the relative position of the socket image capturing means with respect to the first predetermined position and the relative position of the socket image capturing means with respect to the socket, and adds this offset amount to the relative position of the device image capturing means with respect to the first predetermined position so as to calculate the relative position of the device image capturing means with respect to the socket.

Since the offset amount of the first predetermined position with respect to the socket is added to the relative position of the device image capturing means with respect to the first predetermined position so as to calculate the relative position of the device image capturing means with respect to the socket, it is possible to calibrate the relative position of the image capturing means with respect to the socket by a precision equal to the calibration based on the socket itself as a reference.

Usually, in an electronic device test apparatus; for example, the IC devices are tested in a state of room temperature to +125° C. or so of thermal stress. For this reason, when calibrating the relative position of the image capturing means at the time of changing the type of devices, it is necessary to return the temperature of the electronic device test apparatus once to room temperature, then manually calibrate the apparatus. Including the time for raising and lowering the temperature, this takes several hours. As opposed to this, in the present invention, the calibration is performed on the basis of, as a reference, a first predetermined position not dependent on the type of the devices under test, so calibration can be automated. For this reason, at the time of calibration, the electronic device test apparatus does not have to be raised or lowered in temperature and calibration can be completed in several minutes.

Further, with manual calibration, it was difficult to calibrate the image capturing means after raising and lowering the temperature of the electronic device test apparatus. However, in the present invention, the calibration can be automated, so it is possible to calibrate the relative position of the image capturing means even after raising and lowering the temperature of the electronic device test apparatus and, it is possible to perform calibration with a high precision considering also the heat expansion etc. Furthermore, it is also possible to automatically perform calibration at certain periods such as with each start of work or every three days and, it is possible to automatically perform calibration when an earthquake etc. occurs.

Further, since calibration is performed on the basis of, as a reference, a first predetermined position not dependent on the type of the device under test, it is also possible to improve the universality of the calibration jig.

The first predetermined position is not particularly limited so long as it is a part in the capturable range of the socket image capturing means and independent from the test head detached from the electronic device test apparatus at the time of changing the type of the devices under test, but a socket guide positioned above the socket is preferable (see claim 2).

While not particularly limited in the present invention, preferably, in the placement step, the moving means moves the jig from second predetermined position to the first predetermined position for placement (see claim 3).

While not particularly limited in the present invention, preferably the method further comprises a return step of moving the jig from the alignment means to the second predetermined position by the moving means (see claim 4).

While not particularly limited in the present invention, preferably the method further comprises: a second movement step of moving the socket image capturing means above a label fixed at a predetermined fiducial position; a fourth image capturing step of capturing an image of the label by the socket image capturing means; a fourth recognition step of recognizing a relative position of the socket image capturing means with respect to the label on the basis of the image information captured in the fourth image capturing step; a third calculation step of calculating an offset amount of the relative position of the socket image capturing means with respect to the label recognized in the fourth recognition step relative to a preset reference relative position of the socket image capturing means with respect to the label; and a correction step of correcting the relative position of the socket image capturing means with respect to the socket recognized in the third recognition on the basis of the offset amount calculated in the third calculation step (see claim 5).

In a handler using image processing technology, in addition to a device camera capturing an image of an IC device, a socket camera is provided at a device movement system to be able to move together with a contact arm in order to measure the position of the socket.

As explained above, a device under test is tested in a state given a predetermined thermal stress. For this reason, due to heat expansion accompanying this thermal stress, offset ends up occurring in the position of the socket camera with respect to the contact arm and sometimes the socket camera cannot be used to accurately measure the position of the socket and miscontact of the IC device and socket is invited.

Further, since the device camera is designed to be able to move together with the contact arm by the device movement system, vibration occurring at the time of movement etc. causes offset to occur in the position of the socket camera with respect to the contact arm. In this case as well, miscontact of the IC device and socket is sometimes invited.

To deal with this, the present invention compares the relative position of the socket image capturing means with respect to a label fixed to a predetermined fiducial position of the electronic device test apparatus and a preset reference relative position of the socket image capturing means with respect to the label so as to calculate an offset amount, and corrects the relative position of the socket image capturing means with respect to the socket on the basis of the offset amount.

Due to this, even if heat expansion or vibration causes an offset of the position of the socket image capturing means with respect to the contact arm, the offset amount is grasped and reflected back in the measurement of the position of the socket, so it is possible to prevent miscontact of the device under test and the socket.

While not particularly limited in the present invention, preferably the label is fixed at a nonmoving part of the electronic device test apparatus (see claim 6).

As the nonmoving part of the electronic device test apparatus, for example, a part not able to move by an actuator etc. and directly or indirectly fixed to a frame of the electronic device test apparatus can be cited, but more specifically a main base of the electronic device test apparatus may be cited.

(2) To achieve the above object, according to the present invention, there is provided an electronic device test apparatus bringing a device under test into electrical contact with a socket so as to test the device under test, the electronic device test apparatus comprising: a socket image capturing means for capturing an image of the socket; a device image capturing means for capturing an image of the device under test; a moving means to which the socket image capturing means is attached and for moving the device under test; an alignment means to which the device image capturing means is provided and for positioning the device under test relative to the socket; an image processing means for processing image information captured by the socket image capturing means and the device image capturing means; and a calibration jig able to be placed at a first predetermined position, wherein the image processing means has: a first recognition unit recognizing a relative position of the socket image capturing means with respect to the first predetermined position on the basis of an image information of the jig placed at the first predetermined position captured by the socket image capturing means; a second recognition unit recognizing a relative position of the device image capturing means with respect to the first predetermined position on the basis of an image information of the calibration jig positioned at the alignment means captured by the device image capturing means; a third recognition unit recognizing a relative position of the socket image capturing means with respect to the socket on the basis of an image information of the socket captured by the socket image capturing means; a first calculation unit calculating a relative offset amount of the first predetermined position with respect to the socket on the basis of the relative position of the socket image capturing means with respect to the first predetermined position recognized by the first recognition unit and the relative position of the socket image capturing means with respect to the socket recognized by the third recognition unit; and a second calculation unit calculating a relative position of the device image capturing means with respect to the socket on the basis of the relative position of the device image capturing means with respect to the first predetermined position recognized by the second recognition unit and the offset amount calculated by the first calculation unit (see claim 7).

The present invention calculates the offset amount of the first predetermined position with respect to the socket on the basis of the relative position of the socket image capturing means with respect to the first predetermined position and the relative position of the socket image capturing means with respect to the socket, and adds this offset amount to the relative position of the device image capturing means with respect to the first predetermined position so as to calculate the relative position of the device image capturing means with respect to the socket.

Since the offset amount of the first predetermined position with respect to the socket is added the relative position of the device image capturing means with respect to the first predetermined position, so as to calculate the relative position of the device image capturing means with respect to the socket, it is possible to calibrate the relative position of the image capturing means with respect to the socket by a precision equal to calibration based on the socket itself as a reference.

Further, in the present invention, the calibration is performed on the basis of, as a reference, a first predetermined position not dependent on the type of the devices under test, so calibration can be automated. For this reason, at the time of calibration accompanying a change of type of devices, the electronic device test apparatus does not have to be raised or lowered in temperature and calibration can be completed in several minutes.

Further, in the present invention, since the calibration can be automated, so it is possible to calibrate the relative position of the image capturing means even after raising and lowering the temperature of the electronic device test apparatus and, it is possible to perform calibration with a high precision considering also heat expansion etc. Furthermore, it is also possible to automatically perform calibration at certain periods such as with each start of work or every three days and, it is possible to automatically perform calibration when an earthquake etc. occurs.

Further, since calibration is performed on the basis of, as reference, a first predetermined position not dependent on the type of the device under test, it is also possible to improve the universality of the calibration jig.

The first predetermined position is not particularly limited so long as it is a part in the capturable range of the socket image capturing means and independent from the test head detached from the electronic device test apparatus at the time of changing the type of the device under test, but a socket guide positioned above the socket is preferable (see claim 8).

While not particularly limited in the present invention, preferably the apparatus further comprises a storing means for storing the jig (see claim 9).

While not particularly limited in the present invention, preferably the apparatus further comprises a conveying means for carrying the device under test before testing into an operating range of the moving means or carrying the device under test after testing out of an operating range of the moving means, wherein the moving means and conveying means move the jig from the storing means to the first predetermined position (see claim 10).

While not particularly limited in the present invention, preferably the moving means and conveying means move the jig from the alignment means to the storing means (see claim 11).

While not particularly limited in the present invention, preferably the calibration jig comprises: a base member placed at the first predetermined position; and markers provided at least at two points on each of the two main surfaces of the base member so that the position and posture of the jig can be recognized by the socket image capturing means and the device image capturing means (see claim 12).

While not particularly limited in the present invention, preferably the markers are through holes passing through the base member (see claim 13).

By configuring the markers by through holes, it is possible to easily match the positional relationships of the markers at the front and back surfaces of the base member.

While not particularly limited in the present invention, preferably the apparatus further comprises a label fixed to a predetermined fiducial position so as to be able to be captured by the socket image capturing means, wherein the image processing means has: a fourth recognition unit recognizing a relative position of the socket image capturing means with respect to the label on the basis of an image information of the label captured by the socket image capturing means; a third calculation unit calculating an offset amount of the relative position of the socket image capturing means with respect to the label recognized by the fourth recognition unit relative to a preset reference relative position of the socket image capturing means with respect to the label; and a correction unit correcting the relative position of the socket image capturing means with respect to the socket recognized by the third recognition unit on the basis of the offset amount calculated by the third calculation unit (see claim 14).

In the present invention, the label is fixed at the predetermined fiducial position of the electronic device test apparatus, the relative position of the socket image capturing means with respect to this label is compared with the preset reference relative position of the socket image capturing means with respect to the label so as to calculate the offset amount, and the relative position of the socket image capturing means with respect to the socket is corrected on the basis of the offset amount.

Due to this, even if heat expansion or vibration causes a relative offset of the position of the socket image capturing means with respect to the contact arm, the offset amount is grasped and reflected back in the measurement of the position of the socket, so it is possible to prevent miscontact of the device under test and the socket.

While not particularly limited in the present invention, preferably the label is fixed to a nonmoving part of the electronic device test apparatus (see claim 15).

As the nonmoving part of the electronic device test apparatus, for example, a part not able to move by an actuator etc. and directly or indirectly fixed to a frame of the electronic device test apparatus can be cited, but more specifically a main base of the electronic device test apparatus may be cited.

(3) To achieve the above object, there is provided a calibration jig used for calibrating a relative position of a device image capturing means with respect to a socket in an electronic device test apparatus comprising: a socket image capturing means for capturing an image of a socket; and a device image capturing means for capturing an image of a device under test, wherein an alignment means positions the device under test relative to the socket, then a moving means brings the device under test electrically into contact with the socket so as to test the device under test, the calibration jig comprising: a base member placed at a first predetermined position of the electronic device test apparatus; and markers provided at least at two points on each of the two main surfaces of the base member so that a position and posture of the jig can be recognized by the socket image capturing means and the device image capturing means (see claim 16).

In the present invention, the calibration jig used for calibrating the relative position of the device image capturing means with respect to the socket is configured to be placed on a first predetermined position of the electronic device test apparatus. Due to this, it is possible to calibrate on the basis of a first predetermined position not dependent on the type of the IC device as a reference, so calibration can be automated and the universality of the calibration jig can also be improved.

The first predetermined position of the electronic device test apparatus is not particularly limited so long as it is a part in the capturable range of the socket image capturing means and independent from the test head detached from the electronic device test apparatus at the time of changing the type of the device under test, but a socket guide positioned above the socket is preferable (see claim 17).

While not particularly limited in the present invention, preferably the markers are through holes passing through the base member (see claim 18).

By configuring the markers by through holes, it is possible to easily match the positional relationships of the markers at the front and back surfaces of the base member.

EXPLANATION OF REFERENCES

Figure 1:
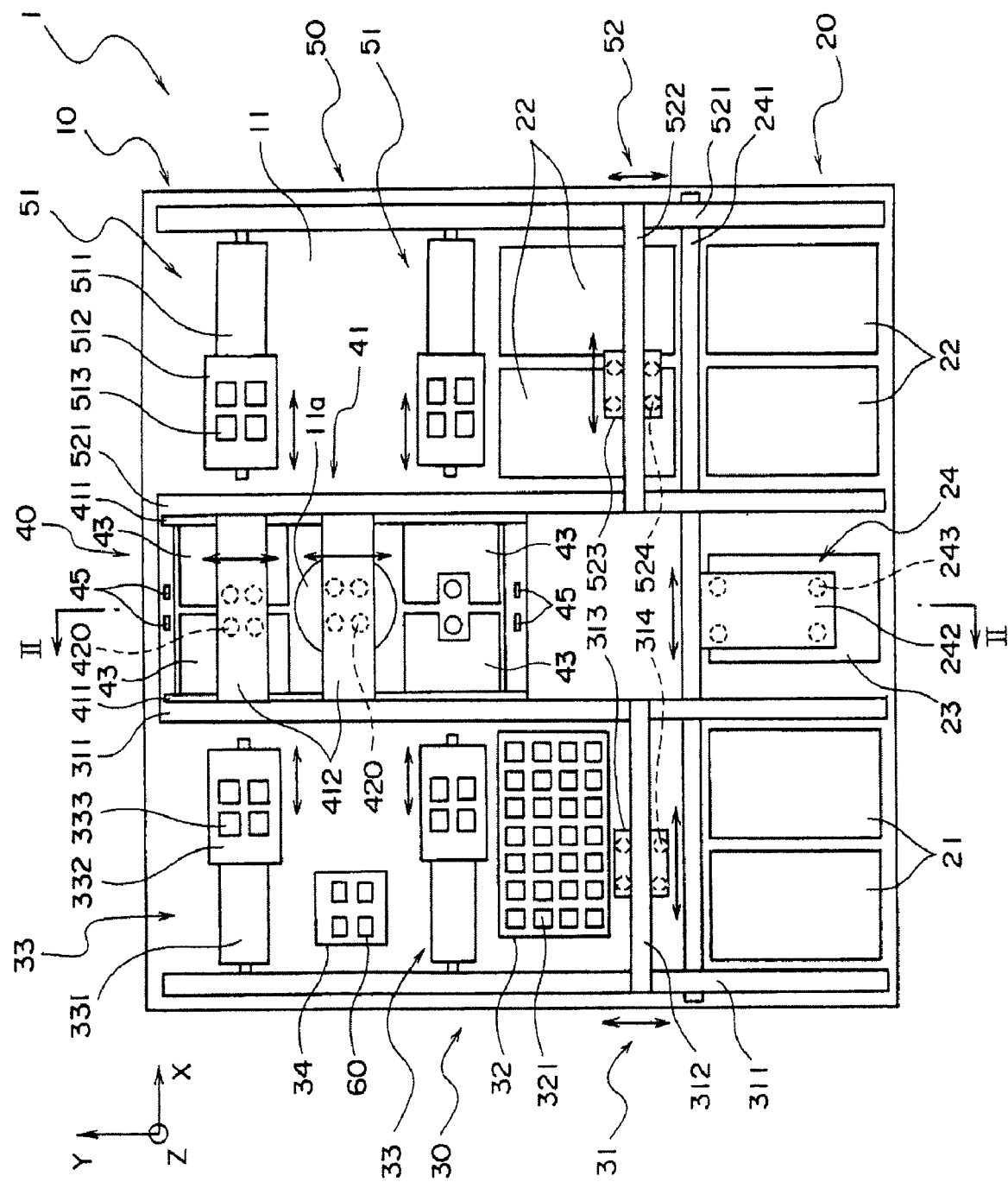
FIG. 1 is a plan view showing an electronic device test apparatus according to an embodiment of the present invention.

1 . . . electronic device test apparatus
10 . . . handler
11 . . . main base
30 . . . loader unit
34 . . . storage location
40 . . . test unit
414 . . . socket camera
420 . . . contact arm
43 . . . alignment system
434 . . . device camera
44 . . . image processing system
45 . . . label
451 . . . seal member
452 to 454 . . . first to third dot patterns
60 . . . calibration jig
70 . . . test head
71 . . . socket
73 . . . socket guide

BEST MODE FOR CARRYING OUT THE INVENTION

Below, an embodiment of the present invention will be explained based on the drawings.

Figure 2:
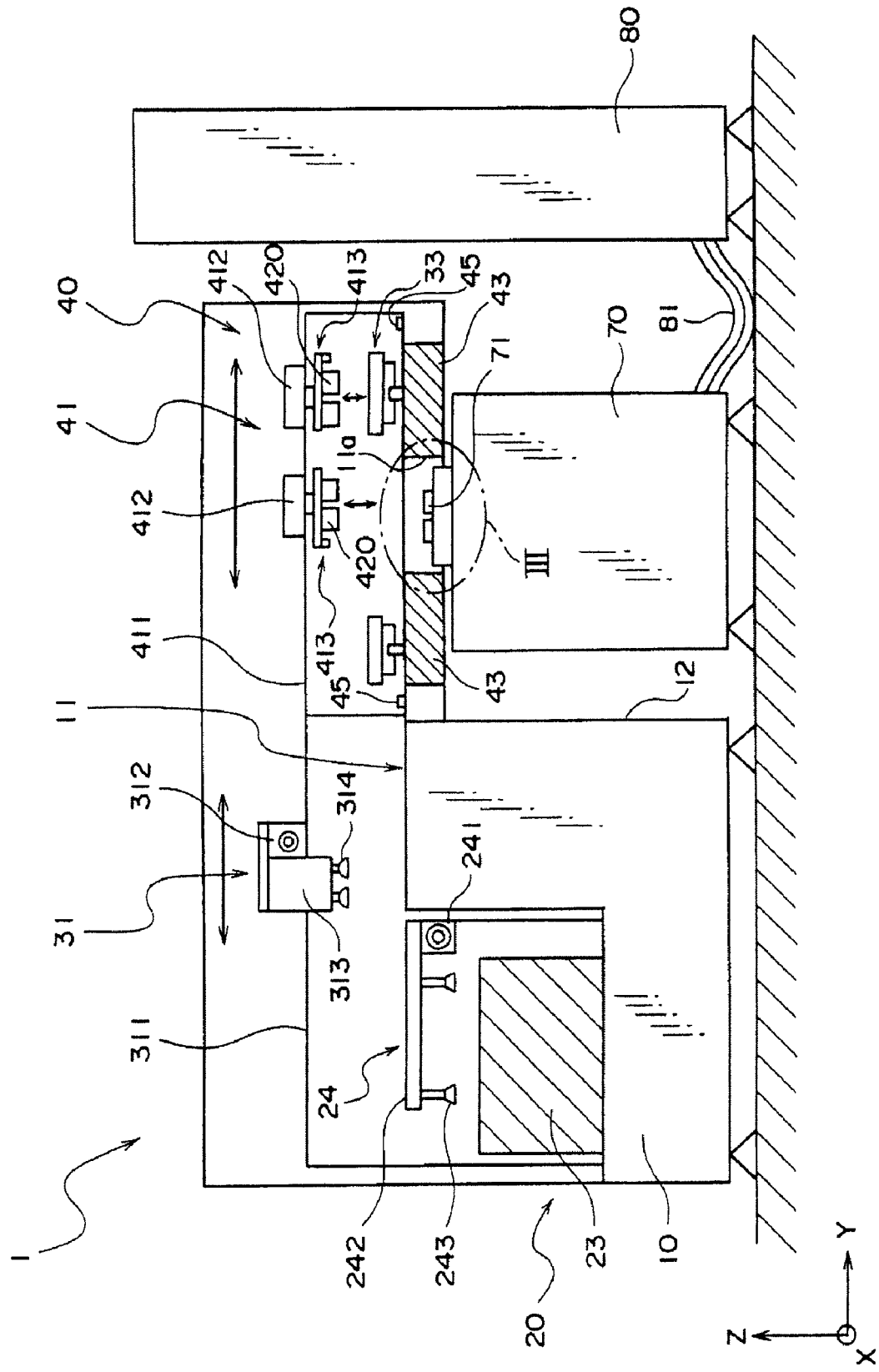
FIG. 2 is a cross-sectional view along the line II-II of FIG. 1.

As shown in FIG. 1 and FIG. 2, an electronic device test apparatus 1 in an embodiment of the present invention comprises a handler 10, a test head 70, and a tester 80. The test head 70 and the tester 80 are connected via cables 81.

The handler 10 comprises a storage unit 20, loader unit 30, test unit 40, and unloader unit 50. IC devices under test is supplied from the storage unit 20 via the loader unit 30 to the test unit 40, the contact arms 420 push the IC devices against the sockets 71 of the test head 70, the tester 80 runs tests on the IC devices via the test head 70 and cables 81, then the unloader unit 50 stores the tested IC devices in the storage unit 20 while classifying them in accordance with the test results.

<Storage Unit 20>

The storage unit 20 comprises supply tray stockers 21, classification tray stockers 22, an empty tray stocker 23, and a tray conveyance system 24 and can store pre-test and post-test IC devices under test.

Each supply tray stocker 21 stores a plurality of supply trays stacked together. Each supply tray carries a plurality of pre-tested IC devices. In the present embodiment, as shown in FIG. 1, the storage unit 20 is provided with two supply tray stockers 21. Note that, in the present invention, the number of the supply tray stockers is not particularly limited to this.

Each classification tray stocker 22 stores a plurality of classification trays stacked together. Each classification tray carries a plurality of tested IC devices. In the present embodiment, as shown in FIG. 1, the storage unit 20 is provided with four classification tray stockers 22. By providing four classification tray stockers 22, it is possible to sort and store IC devices in a maximum of four classifications in accordance with the test results. That is, it is possible to sort them into not only classifications of good devices and defective devices, but also, among the good devices, ones with high operating speeds, medium speeds, and low speeds or, among the defective devices, ones which require retesting. Note that, in the present invention, the number of the classification tray stockers is not limited to this.

The empty tray stocker 23 stores a plurality of empty trays stacked together. Each empty tray is a tray which is emptied when all IC devices loaded on a supply tray are fed to the loader unit 30.

Note that the supply trays, classification trays, and empty trays, while not particularly shown, are trays of the same shape formed with pluralities of recesses able to hold IC devices. In the present embodiment, for convenience, trays carrying pre-test IC devices are called "supply trays", trays carrying post-test IC devices are called "classification trays", and trays not carrying any IC devices are called "empty trays".

The stockers 21 to 23, while not particularly shown, are provided with elevators able to move along the Z-axial direction. A plurality of trays can be raised or lowered in a stacked state.

The tray conveyance system 24, as shown in FIG. 1, comprises a support rail 241, a movable head 242 and suction heads 243, and is designed to be able to move trays along the X-axial direction and Z-axial direction. This tray conveyance system 24 has an operating range including the supply tray stockers 21, empty tray stocker 23, and classification tray stockers 22.

The support rail 241 is provided on a main base 11 of the handler 10 along the X-axial direction. The movable head 242 is supported on this support rail 241 so as to be able to move along the X-axial direction. Four suction pads 243 are attached to the movable head 242 downward, and are able to move along the Z-axial direction by a not shown actuator.

The tray conveyance system 24 transfers an empty tray emptied after supplying all pre-test IC devices to the loader unit 30 from a supply tray stocker 21 to the empty tray stocker 23. Further, the tray conveyance system 24 transfers an empty tray from the empty tray stocker 23 to a classification tray stocker 22 when a classification tray becomes full with tested IC devices.

<Loader Unit 30>

The loader unit 30 comprises a first device conveyance system 31, heat plate 32 and two first buffer units 33. It can take out pre-test IC devices from the storage unit 20, apply predetermined thermal stress, then supply them to the test unit 30.

The first device conveyance system 31, as shown in FIG. 1, comprises support rails 311, a movable rail 312, a movable head 313 and suction pads 314, and can move four IC devices along the X-Y-Z axial directions. This first device conveyance system 31 has an operating range including the supply tray stockers 21, heat plate 32, and first buffer units 33.

The support rails 311 are provided on the main base 11 of the handler 10 along with the Y-axial direction. The movable rail 312 is supported between two support rails 311 so as to be able to move along the Y-axial direction. The movable head 313 is provided on the movable rail 312 so as to be able to move along the X-axial direction. The suction pads 314 are attached to the movable head 313 downward, and are able to move in the Z-axial direction by a not shown actuator.

This first device conveyance system 31 conveys four IC devices at the same time from a supply tray of a supply tray stocker 21 to the heat plate 32, the heat plate 32 applies predetermined thermal stress to the IC devices, then the system transfers the IC devices from the heat plate 32 to the first buffer units 33.

The heat plate 32 is, for example, a metal plate having a heat source (not shown) below it, and is able to apply a predetermined thermal stress to the pre-test IC devices. At the top surface of this heat plate 32, a plurality of recesses 321 able to hold IC devices are formed.

Each first buffer unit 33, as shown in FIG. 1, comprises an actuator 331 and a movable head 332, and is able to move IC devices from the region of the loader unit 30 to the region of the test unit 40.

The actuator 331 is provided on the main base 11 of the handler 10 so as to be able to extend and retract along the X-axial direction. The movable head 332 is fixed to the front end of the drive shaft of the actuator 331. On the top surface of the movable head 332, four recesses 333 able to hold IC devices are formed.

When the first device conveyance system 31 drops four IC devices into the recesses 333 of the movable head 332, the first buffer unit 33 extends the actuator 331 and moves the four IC devices from the region of the loader unit 30 to the region of the test unit 40 at the same time.

Furthermore, in the present embodiment, as shown in FIG. 1, a storage location 34 for storing a calibration jig 60 is provided between the two first buffer units 33 in the board 11 of the handler 10. Note that the calibration jig 60 will be explained later. In the present embodiment, this storage location 34 is also included in the operating range of the first device conveyance system 31.

<Test Unit 40>

The test unit 40 comprises a device movement system 41 and four alignment systems 43, and relatively positions the pre-test IC devices with respect to the sockets 71 with a high precision using image processing technology, then can push the IC devices against the sockets 71 of the test head 70.

As shown in FIG. 2, a space 12 is formed at the bottom of the test unit 40. The test head 70 is inserted into this space 12. The test head 70 is therefore positioned below the test unit 40.

Figure 3:
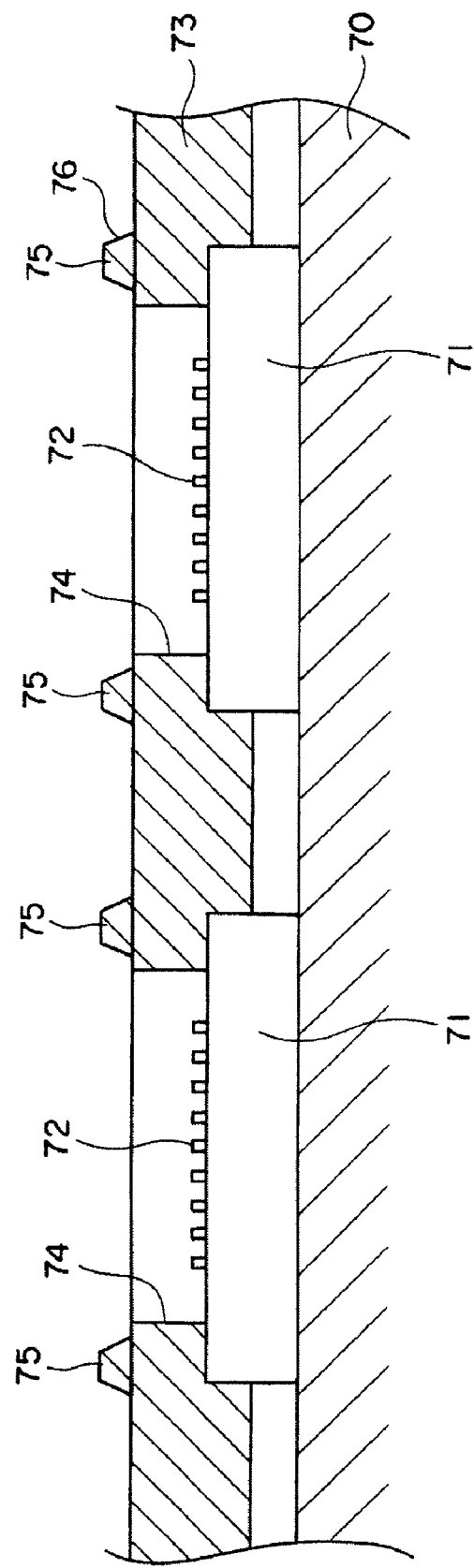
FIG. 3 is an enlarged view of the part III of FIG. 2.

As shown in FIG. 2 and FIG. 3, an opening 11a is formed on the main base 11 of the handler 10 in the test unit 40. Four sockets 71 are attached to the top of the test head 70. Each socket 71 comprises a large number of contact pins 72 arranged so as to correspond to the input/output terminals of the IC devices. Further, the sockets 71 attached to the top of the test head 70 approach the inside of the handler 10 via the opening 11a.

Furthermore, as shown in FIG. 3, a socket guide 73 for fixing the sockets 71 is provided at the tops of the sockets 71. The sockets 71 are fabricated especially according to the type of the IC device, while the socket guide 73 does not particularly depend on the type of the IC device.

The socket guides 73 are provided with openings 74 for allowing contact pins 72 of the socket 71 to approach the inside of the handler 10. Around each of these openings 74, two positioning pins 75 for positioning the calibration jig 60 (explained later) are provided so as to stick out upward. The positioning pins 75 are formed tapered at the outer circumferential surfaces 76.

The device movement system 41, as shown in FIG. 1 and FIG. 2, comprises support rails 411, movable rails 412 and movable heads 413, and is able to move the IC devices along the X-Y-Z axial directions. This device movement system 41 has an operating range including the sockets 71 approaching the inside of the handler 10 through the opening 11a and the alignment systems 43.

The support rails 411 are provided on the main base 11 of the handler 10 along the Y-axial direction. The movable rails 412 are supported between the two support rails 411 so as to be able to move along the Y-axial direction. The movable heads 413 are supported on the movable rails 41 so as to be able to move in the X-axial direction.

Note that, as shown in FIG. 1, in the present embodiment, two movable rails 412 are supported independently movable between the two support rails 411. For this reason, while one movable rail 412 is moving to an alignment system 43 where the IC devices are aligned in position, the other movable rail 412 is moving above the sockets 71 where the IC devices can be tested.

Figure 4:
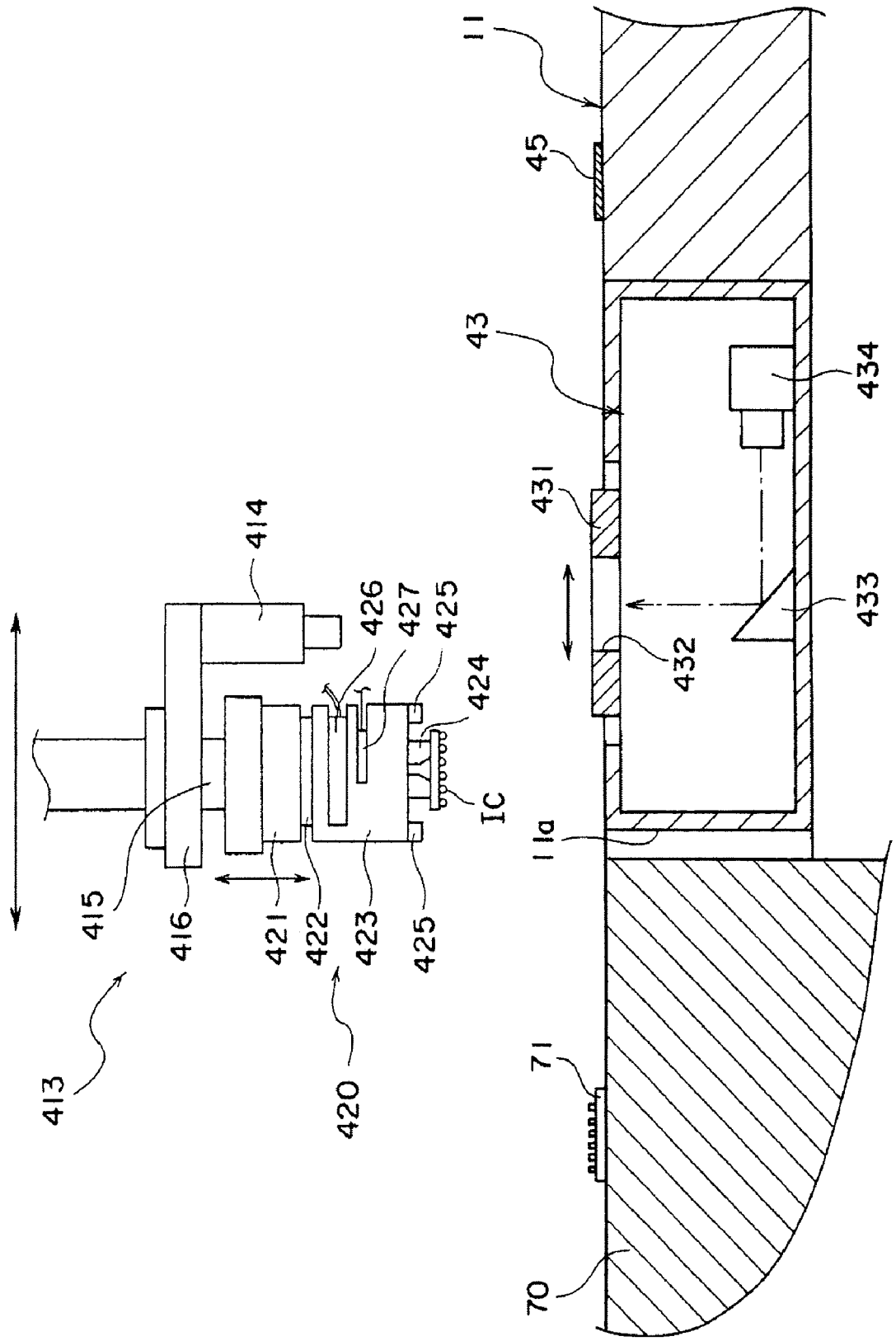
FIG. 4 is a schematic cross-sectional view of a contact arm and alignment system in an embodiment of the present invention.

Each movable head 413, as shown in FIG. 4, comprises socket cameras 414, actuator 415 and four contact arms 420. The four contact arms 420 are attached at the movable head 413 downward so as to match with the array of four sockets 71 provided at the test head 70. Note that, in FIG. 4, for convenience, only one contact arm 420 is shown, but in actuality, as shown in FIG. 1, four contact arms 420 are attached at the front end of a drive shaft of the actuator 415 in two rows and two columns. Further, in FIG. 4, only one socket camera 41 is shown for one movable head 413, but in actuality, two socket cameras 414 are arranged along the X-axial direction.

Each socket camera 414 is for example a CCD camera fixed through a camera support member 416 to the movable rail 412 downward and can capture an image of a socket 71 of the test head 70. This socket camera 414 is used for recognizing the position and posture of the socket 71.

The actuator 415 is fixed to the movable rail 412 so as to be able to extend and retract along the Z-axial direction, and the four contact arms 420 is attached to the front end of the drive shaft.

Each contact arm 420 comprises a stationary side contact arm 421, a lock and free mechanism 422 and a holding side contact arm 423.

The stationary side contact arm 421 is fixed to the drive shaft of the actuator 415 at the top end, and is coupled with the holding side contact arm 423 via the lock and free mechanism 422 at the bottom end.

The lock and free mechanism 422, while not particularly shown, can utilize pressurized air to constrain or free relative movement of the holding side contact arm 423 with respect to the stationary side contact arm 421 along the XY plane and relative rotation about the Z-axis. Further, this lock and free mechanism 422 is also provided with a centering function for matching the centerline of the stationary side contact arm 421 and the centerline of the holding side contact arm 423.

The holding side contact arm 423 is provided at its bottom end with a suction pad 424 for picking up an IC device by suction and is provided with a ring-shaped abutting member 425 so as to surround the same.

Further a heater 426 and a temperature sensor 427 are buried inside the holding side contact arm 423. It is possible to detect the temperature of the holding side contact arm 423 by the temperature sensor 427 so as to indirectly measure the temperature of the IC device and it is possible to control the heater 426 to turn on/off on the basis of this measurement value so as to maintain the thermal stress applied by the heat plate 32.

Each alignment system 43, as shown in FIG. 4, comprises a stage 431, a mirror 433 and a device camera 434. By aligning the position or posture of the holding side contact arm 423 abutting against the stage 431, an IC device can be positioned with a high precision with respect to a socket 71. Note that, in the present embodiment, as shown in FIG. 1, two sets, that is, a total of four, alignment systems 43 are provided so as to correspond to the device movement system 41 being provided with two movable heads 413.

The stage 431 can move along the XY plane and rotate about the Z-axis by a not shown motor mechanism. Further, at the approximate center of the stage 431, an opening 432 having an inside diameter through which an IC device can pass and against which the ring-shaped abutting member 425 can abut is formed.

Further, in the state where the lock and free mechanism 422 is free, the holding side contact arm 423 abuts against the stage 431, the stage 431 moves and the holding side contact arm 423 tracks this movement whereby the IC device held by the holding side contact arm 423 is aligned in position.

The device camera 434 is for example a CCD camera set lying down along the XY plane. It is possible to capture an image of the IC device picked up by suction of the holding side contact arm 423 via the mirror 433 and opening 432 of the stage 431. This device camera 434 is used each time before the test in order to position an IC device with respect to a socket 71 before pushing the IC device against the socket 71.

Furthermore, in the present embodiment, as shown in FIG. 1, FIG. 2, and FIG. 4, a label 45 is provided on the line passing through the socket 71 and stage 431.

Figure 5:
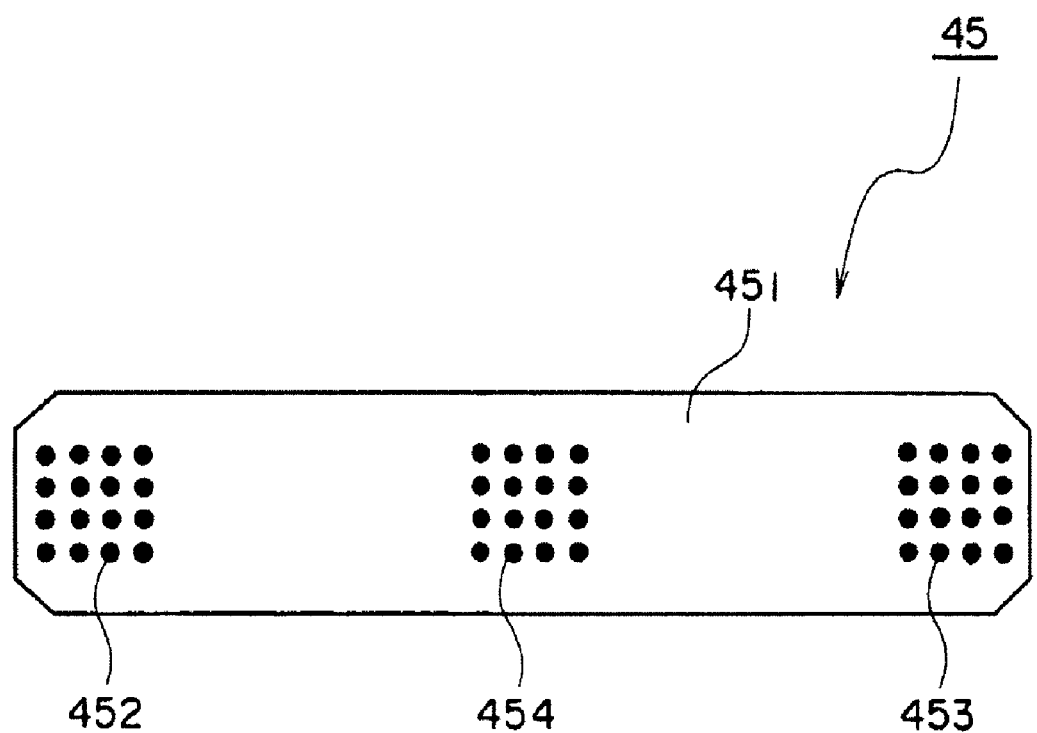
FIG. 5 is a plan view showing a label in an embodiment of the present invention.

This label 45, as shown in FIG. 5, comprises a sheet-like thin seal member 451 on the back surface of which an adhesive or bond is coated. On the surface of this seal member 451, dot patterns 452 to 454 of 16 dots arranged in four rows and four columns are printed at the left and right ends and the center, that is, a total of three locations.

This label 45 is adhered and fixed to the main base 11 in the test unit 40 and is designed not to move together with the movable contact arm 420 and exchangeable socket 71. This label 45 is captured by the socket camera 414 in order to grasp the offset of position of the socket camera 414 due to heat expansion or vibration.

As shown in the electronic device test apparatus 1 according to the present embodiment, when two socket cameras 414 are provided for one movable head 413, one socket camera 414 captures an image of the first dot pattern 452 printed at the left end, while the other socket camera 414 captures an image of the second dot pattern 452 printed at the right end. In this case, the third dot pattern 454 printed at the center is not particularly used.

As opposed to this, when using the label 45 for an electronic device test apparatus of a type where one movable head 413 is provided with only one socket camera 414, the socket camera 414 captures the third dot pattern 454 printed at the center, and the first and second dot patterns 452 and 453 are not particularly used.

In this way, this label 45 can be used for both the type at which one socket camera 414 is provided for one movable head and the type at which two socket cameras 414 are provided.

Figure 6:
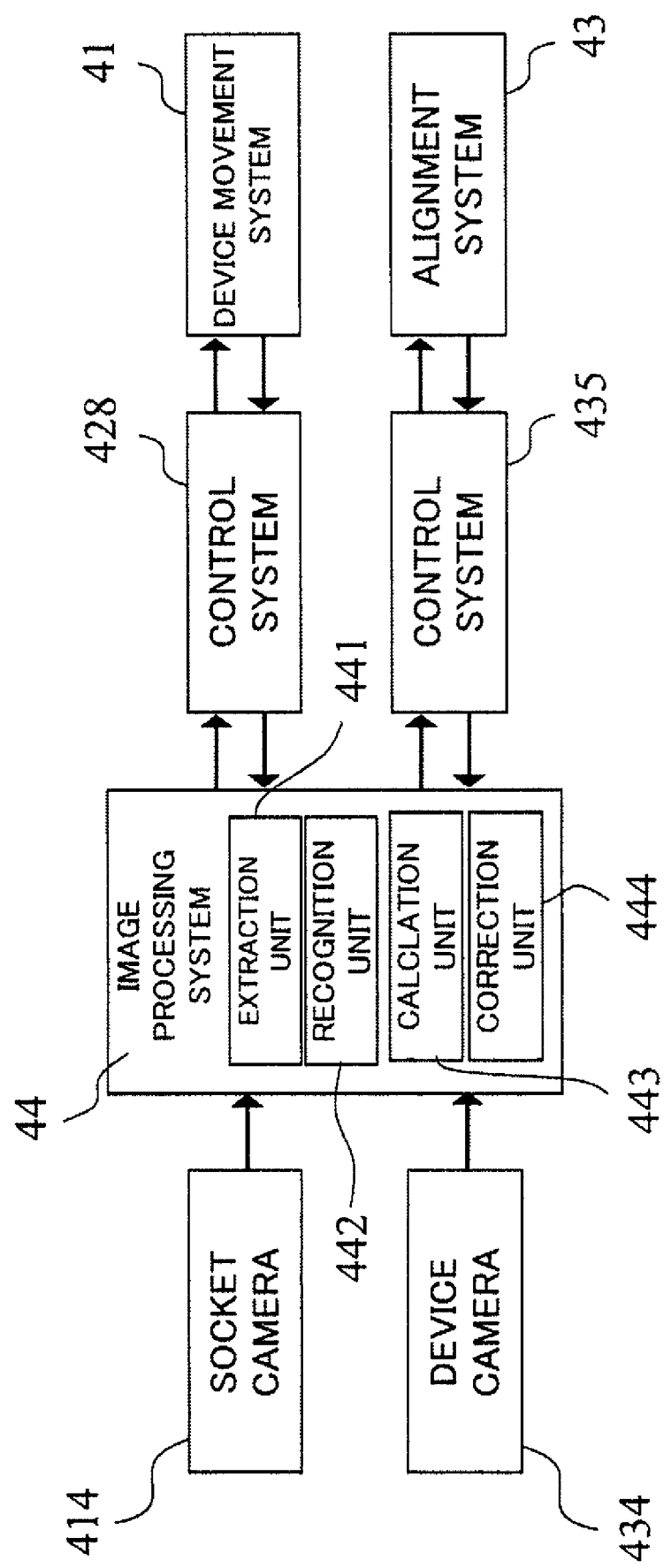
FIG. 6 is a block diagram showing the configuration of an image processing system and its surroundings of an embodiment of the present invention.

This device camera 434 and the above-mentioned socket camera 414, as shown in FIG. 6, are connected to an image processing system 44 so as to be able to send the captured image information to the image processing system 44.

The image processing system 44 is composed of a not particularly shown image processing processor, ROM, RAM, etc., and can process the image information captured by the device camera 434 and recognize the position and posture of the IC device picked up by suction by the holding side contact arm 423 on the occasion of testing an IC device. Furthermore, the image processing system 44 calculates the alignment amount required for relatively matching the recognized position and posture of the IC device with the preset position and posture of the socket 71, and sends this alignment amount to the control system 435 of the alignment system 43. The control system 435 of the alignment system 43 controls the motor mechanism of the alignment system 43 (not shown) on the basis of the alignment amount and aligns the position or posture of the IC device.

The image processing system 44 of the present embodiment, as shown in FIG. 6, functionally comprises an extraction unit 441, recognition unit 442, calculation unit 443 and correction unit 444.

The extraction unit 441 is designed to be able to process the image information captured by the cameras 414 and 434 so as to extract the position or posture of the socket 71, jig 60 or label 45.

The recognition unit 442 is designed to be able to recognize the relative positions of the cameras 414 or 434 with respect to the socket 71, socket guide 73 or label 45 on the basis of the extraction results of the extraction unit 441.

The calculation unit 443 is designed to calculate the relative offset amount of the socket guide 73 with respect to the socket 71 and the relative position of the device camera 434 with respect to the socket 71 on the basis of the recognition results of the recognition unit 442. Further, this calculation unit 443 is designed to be able to compare the relative position of the socket camera 414 with respect to the label 45 with a preset reference relative position of the socket camera 414 with respect to the label 45 and calculate the offset amount.

The correction unit 444 is designed to be able to correct the relative position of the socket camera 414 with respect to the socket 71 recognized by the recognition unit 442 on the basis of the offset amount of the relative position of the socket camera 414 with respect to the label 45 calculated by the calculation unit 443.

<Unloader Unit 50>

The unloader unit 50, as shown in FIG. 1, comprises two second buffer units 51 and a second device conveyance system 52, carries out the tested IC devices from the test unit 40 and moves the IC devices to the storage unit 20 while sorting the devices according to the test results.

Each second buffer unit 51, like each first buffer unit 33, comprises an actuator 511 and a movable head 512, and is designed to move IC devices from the region of the test unit 40 to the region of the unloader unit 50.

The actuator 511 is provided on the main base 11 of the handler 10 so as to be able to extend and retract along the X-axial direction. The movable head 512 is fixed to the front end of the drive shaft of the actuator 511. On the top surface of the movable head 512, four recesses 513 able to hold IC devices are formed.

When the device movement system 41 drops four IC devices into the recesses 513 of the movable head 512, the second buffer unit 51 retracts the actuator 511 and moves the four IC devices from the region of the test unit 40 to the region of the unloader unit 50 at the same time.

The second device conveyance system 52, like the first device conveyance system 31, comprises support rails 521, a movable rail 522, a movable head 523 and suction pads 524, and can move four IC devices along the X-Y-Z axial directions. This second device conveyance system 52 has a range of operation including the second buffer units 51 and four classification tray stockers 22.

The support rails 521 are provided on the main base 11 of the handler 10 along the Y-axial direction. The movable rail 522 is supported between the two support rails 521 so as to be able to move along the Y-axial direction. The movable head 523 is provided on the movable rail 522 so as to be able to move along the X-axial direction. The suction pads 524 are attached to the movable head 523 downward, and are able to move along the Z-axial direction by a not shown actuator.

This second device conveyance system 52 moves the tested IC devices from the second buffer units 51 to the classification trays of the classification tray stockers 22 in accordance with the test results.

Below, referring to FIG. 7, the alignment method of the position of an IC device by the electronic device test apparatus 1 according to the present embodiment will be explained in brief.

A contact arm 420 of the device movement system 41 picks up by suction an IC device supplied from the storage unit 20 via the loader unit 30 to the test unit 40 and moves it to the stage 431 of the alignment system 43. Further, in the state where the holding side contact arm 423 abuts against the stage 431, the device camera 434 captures an image of the IC device held by the holding side contact arm 423 via the opening 432. The image information is sent to the image processing system 44 (step S100). The image processing system 44 processes this image information and, for example, extract the position and posture of the IC device on the basis of the contours etc. of the input/output terminals or package of the IC device (step S110).

Next, the position and posture of the IC device calculated in step S110 is compared with the pre-recognized position and posture of the socket 71 (step S120). In this comparison, when the position and posture of the IC device matches the position and posture of the socket 71 relatively (YES at step S120), the alignment of the position and posture of the IC device ends.

When the position and posture of the IC device and the position and posture of the socket 71 relatively do not match in step S120 (NO at step S120), the image processing system 44 calculates the alignment amount so as to relatively match the position and posture of the IC device with the position and posture of the socket 71 (step S130).

Next, the lock and free mechanism 422 unlocks the relative movement of the holding side contact arm 423 with respect to the stationary side contact arm 421 (step S140), then the stage 431 of the alignment system 43 moves by the alignment amount, and the holding side contact arm 423 tracks this movement whereby the position and posture of the IC device are aligned (step S150).

Next, the image processing system 44 again compares the position and posture of the IC device and the preset position and posture of the socket 71 (step S160). When these do not match relatively (NO at step S160), the required alignment amount is calculated by returning to step S130.

When the position and posture of the IC device and the position and posture of the socket 71 relatively match in the comparison of step S160 (YES at step S160), the lock and free mechanism 422 locks the relative movement of the holding side contact arm 423 with respect to the stationary side contact arm 421 (step S170).

After the above alignment of the position and posture of the IC device ends, the device movement system 41 moves the IC device to the socket 71 and pushes the IC device against the socket 71 so as to electrically contact the input/output terminals of the IC device and the contact pins 72 of the socket 71. In this state, the tester 80 tests the IC device via the cables 81 and a test head 70.

Figure 8:
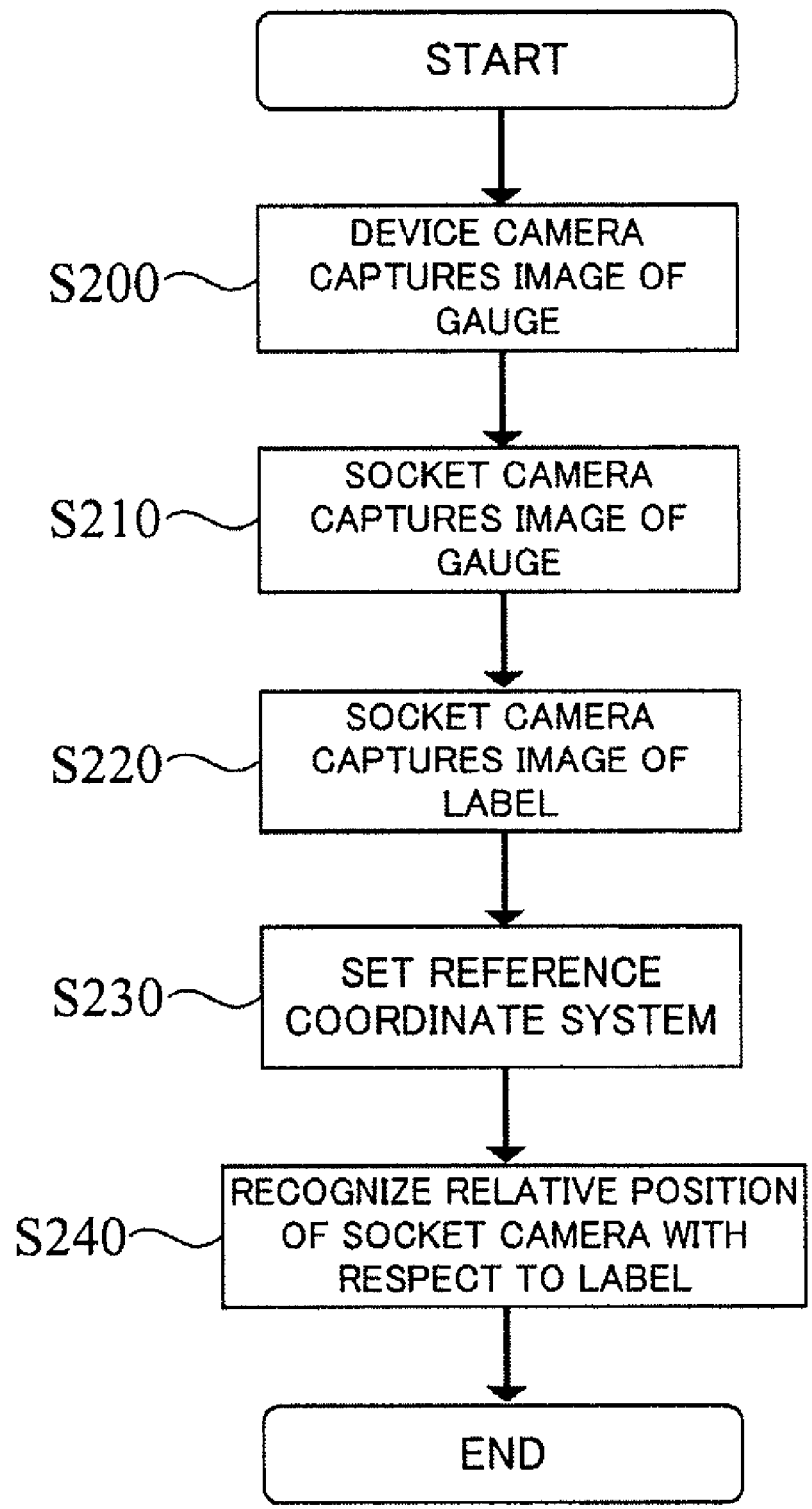
FIG. 8 is a flowchart showing a method of reference calibration in an embodiment of the present invention.

Below, while referring to FIG. 8, the reference calibration of the cameras 414 and 434 performed when setting or starting up the electronic device test apparatus 1 according to the present embodiment will be explained in brief.

First, a calibration gauge (not shown) is placed on the stage 431 of the alignment system 43. This gauge is, for example, composed of a transparent plate on which coordinate axes are printed. The coordinate axes are positioned at the opening 432 and can be captured by the device camera 434. Further, the device camera 434 captures an image of the gauge (step S200). Next, the socket camera 414 moves above the gauge and the socket camera 414 also capture an image of the gauge (step S210). Furthermore, the socket camera 414 moves above the label 45 and the socket camera 414 captures an image of the label 45 (step S220).

Next, the image processing system 44 processes the image information captured in steps S200 and S210, extracts the position and posture on the coordinate axes printed on the gauge, and sets the reference coordinate system common to the cameras 414 and 434 (step S230).

Figure 14:
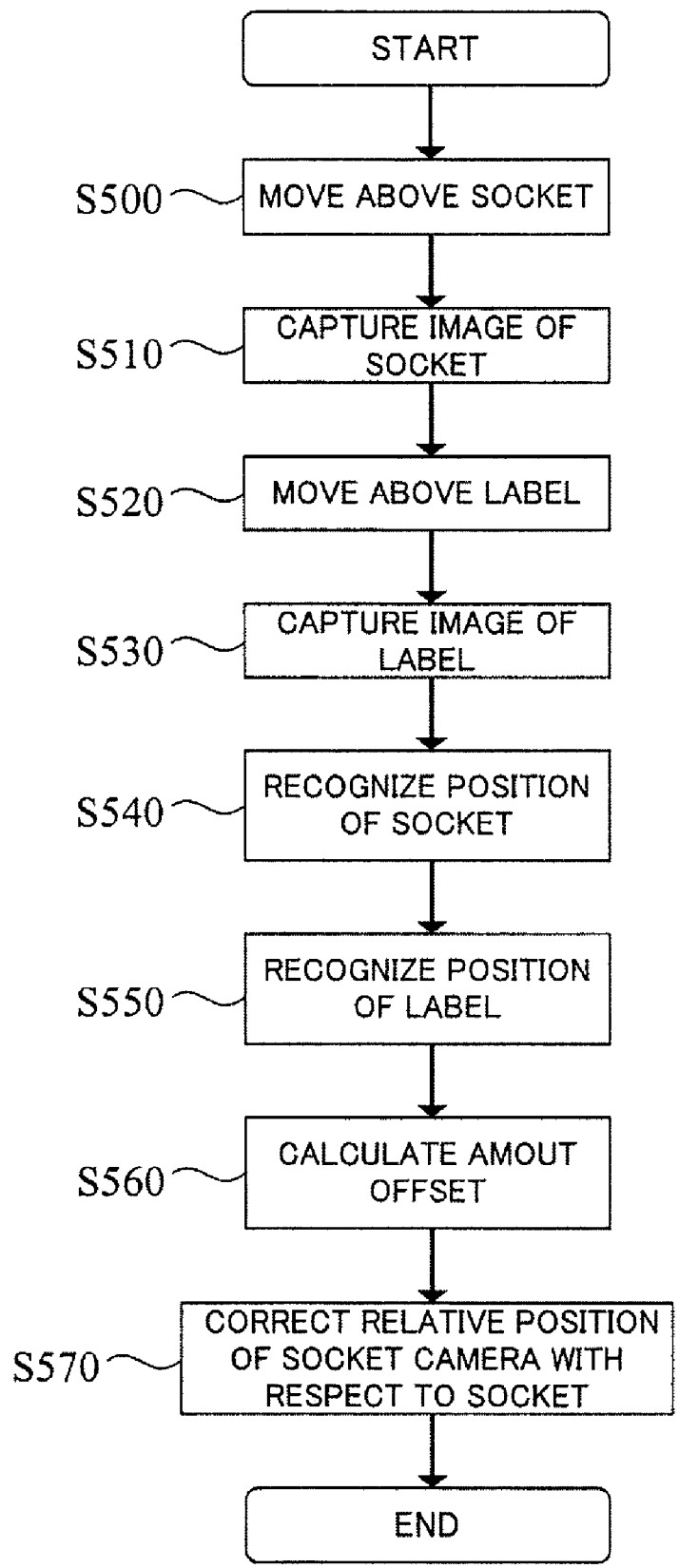
FIG. 14 is a flowchart showing a method of correction of the relative position of a socket camera in an embodiment of the present invention.

Furthermore, it processes the image information captured in step S220, extracts the position and posture of the label 45 in the image information on the basis of the position and posture of the dot patterns 452 and 453 printed on the label 45. Based on this position and posture, the relative position of the socket camera 414 with respect to the label 45 is recognized (step S240). The relative position of the socket camera 414 with respect to the label 45 recognized in this step S240 is set as the reference relative position used in step S560 of FIG. 14 explained later.

Below, referring to FIG. 9 to FIG. 13, the calibration method of the relative positions of the socket camera and device camera performed when changing the type of IC devices etc. will be explained.

First, the configuration of the calibration jig 60 used for the calibration will be explained.

Figure 9:
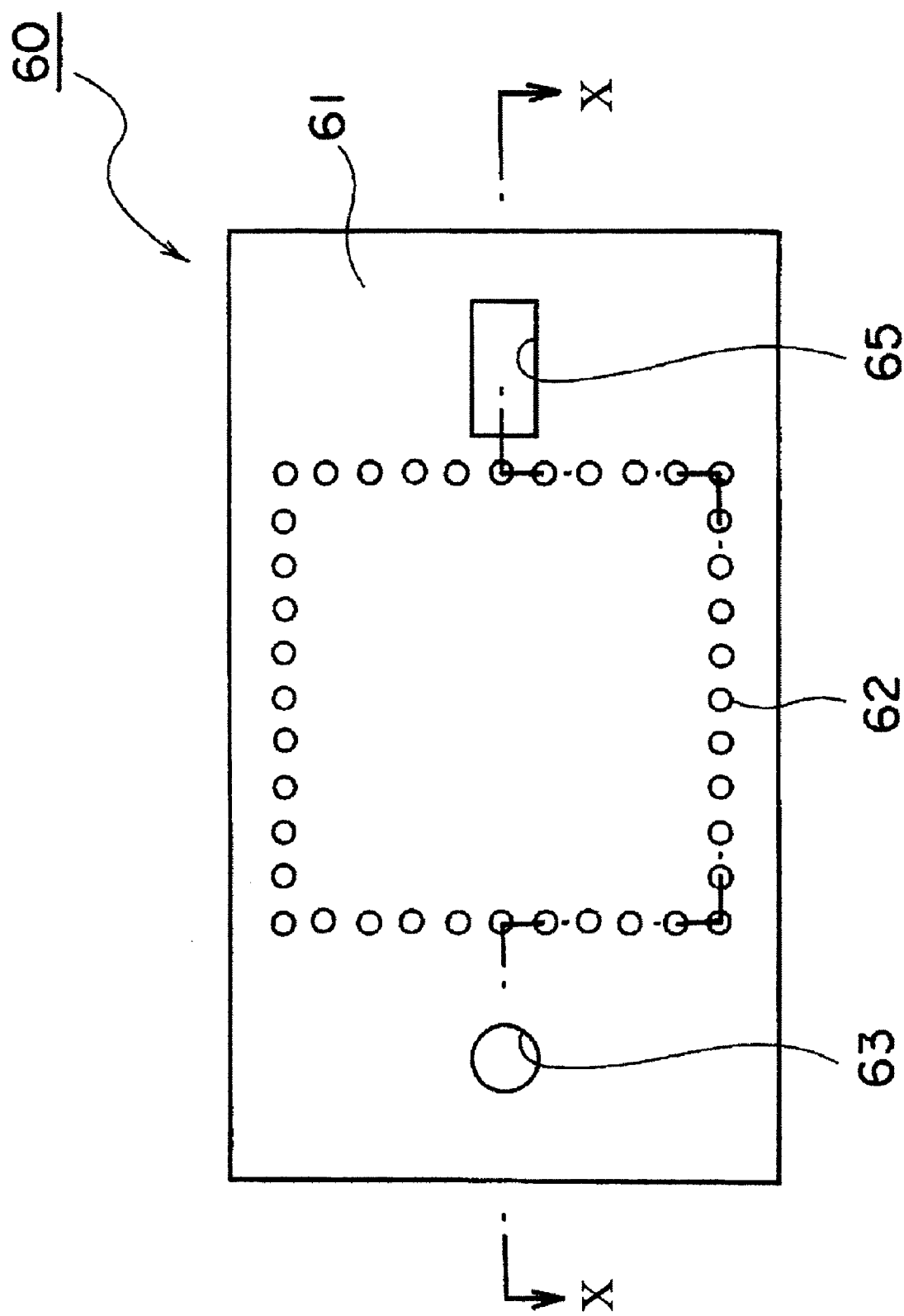
FIG. 9 is a plan view showing a calibration jig according to an embodiment of the present invention.
Figure 10:
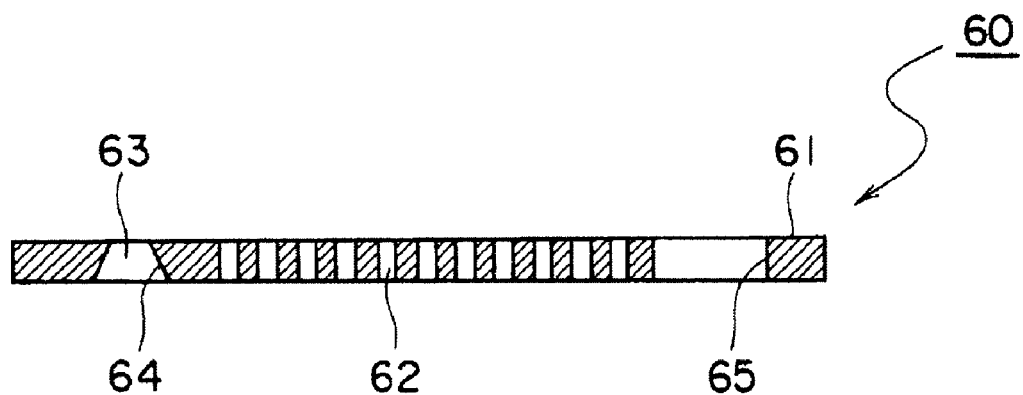
FIG. 10 is a cross-sectional view along a line X-X of FIG. 9.

The calibration jig 60 is a jig used for calibration the relative position of the camera 434 with respect to a socket 71 when a socket 71 is changed along with a change in type of IC devices. As shown in FIG. 9 and FIG. 10, a base member 61 and markers 62 are provided.

The base member 61 is a flat plate shaped member made of for example a polyphenylene sulfide (PPS) resin, other resin, aluminum or another metal. The markers 62 are composed of a plurality of through holes running from the front surface to the back surface of this base member 61. In the present embodiment, 40 through holes are arranged in a rectangular shape.

Note that in the present invention, the formation position and arrangement of the through holes are not particularly limited. It is sufficient that through holes be provided at least at two locations on the both main surfaces of the base member 61 so that the position and posture of the jig 60 can be recognized by the cameras 414 and 434. Note that the greater the number of through holes, the more accurately the position and posture of the jig 60 can be recognized.

Further, the markers 62 may also be composed of printed dots. However, while the socket camera 414 captures an image of the top surface of the jig 60, the device camera 434 captures an image of the bottom surface of the jig 60, so the markers 62 made of through holes makes it easy to match the positions of the markers 62 on the front and back surfaces.

First and second insertion holes 63, 65 into which positioning pins 75 of the socket guide 73 are inserted are formed at the both sides of the markers 62 arranged in the rectangular shape. As shown in FIG. 10, the first insertion hole 63 has an inner circumferential surface 64 corresponding to the tapered outer circumferential surface 76 of the positioning pins 75. As opposed to this, the second insertion hole 65 has an inside diameter expanding along the longitudinal direction of the jig 60. Due to the second insertion hole 65, it is possible to absorb mechanical pitch error occurring in the insertion holes 63, 65 or positioning pins 75.

Note that the calibration jig 60 explained above is usually stored at a storage location 34 of the above-mentioned loader unit 30 (see FIG. 1). Note that, in the present invention, this storage location may be provided at the test unit 40 or unloader unit 50. The location is not particularly limited so long as in the device conveyance system of the handler.

Figure 11:
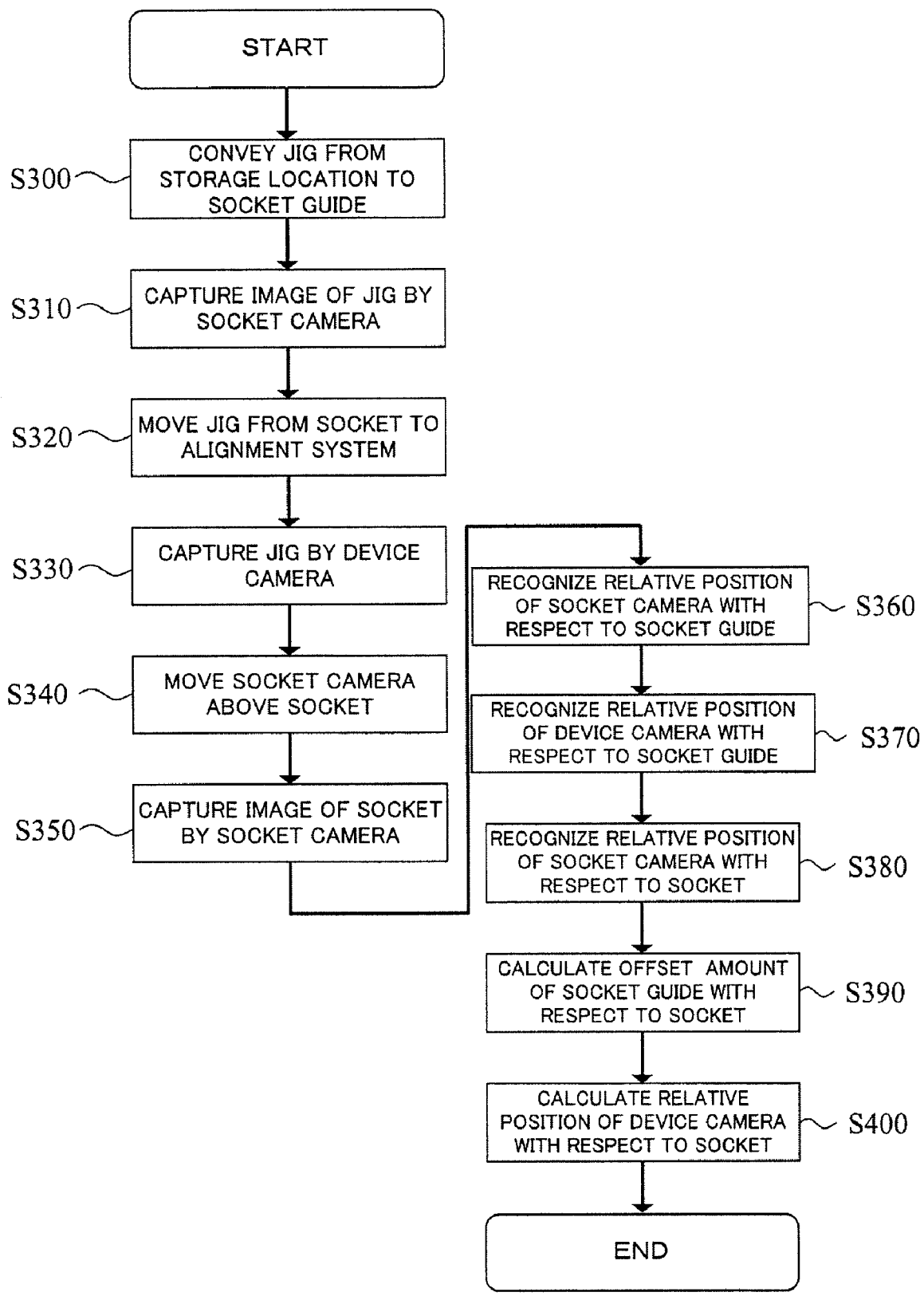
FIG. 11 is a flowchart showing a calibration method of relative positions of a socket camera and device camera according to an embodiment of the present invention.

Next, the calibration method of the relative position of the socket camera and device camera according to the present embodiment will be explained with reference to FIG. 11.

First, the first device conveyance system 31 moves the calibration jig 60 from the storage location 34 to a first buffer unit 33, the first buffer unit 33 moves the jig 60 from the region of the loader unit 30 to the region of the test unit 40, and then the device movement system 41 moves the jig 60 from the first buffer unit 33 to the socket guide 73 for placement (step S300).

Figure 12:
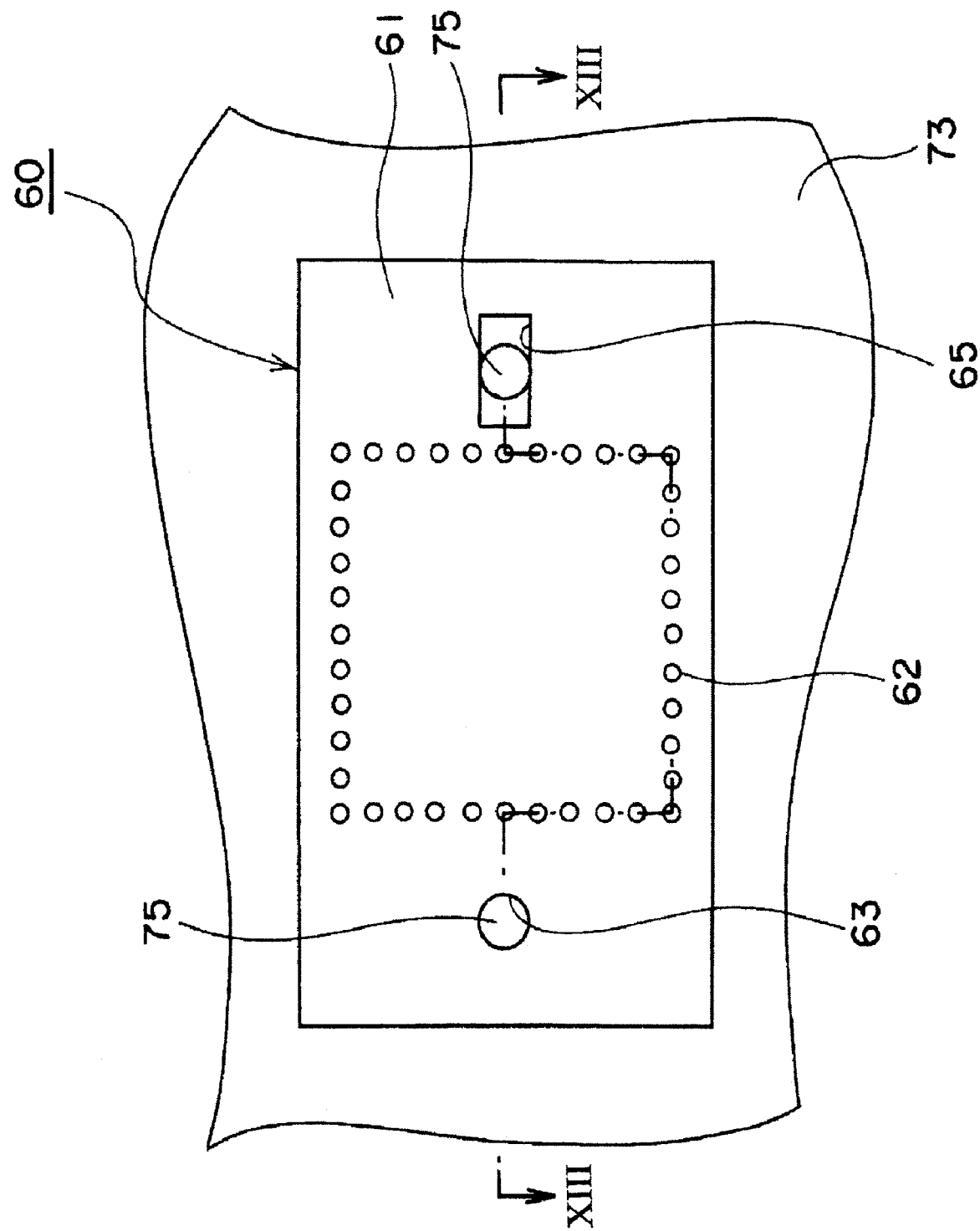
FIG. 12 is a partial plan view showing a state of a calibration jig placed at a socket guide according to the present embodiment.
Figure 13:
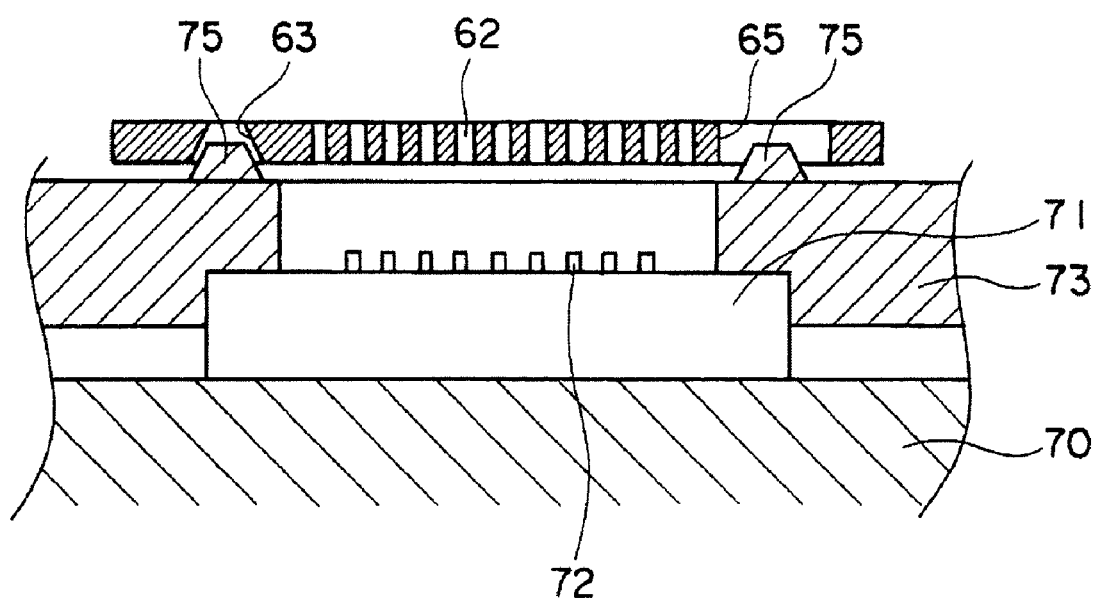
FIG. 13 is a cross-sectional view along a line XIII-XIII of FIG. 12.

When the jig 60 is placed on the socket guide 73, as shown in FIG. 12 and FIG. 13, the positioning pins 75 of the socket guide 73 are guided along the tapered inner circumferential surfaces 64 of the first insertion holes 63 and 65 of the jig 60. The jig 60 is automatically positioned with respect to the socket guide 73.

Next, the socket camera 414 captures an image of the jig 60 carried on the socket guide 73 (step S310).

Next, the device movement system 41 moves the jig 60 from the socket guide 73 to the stage 431 of the alignment system 43 (step S320) and the device camera 434 captures an image of the jig 60 in the state with the holding side contact arm 423 abutting against the stage 431 (step S330).

Next, the device movement system 41 moves the socket camera 414 above the socket 71 in the state with the jig 60 not placed on the socket guide 73 (step S340) and the socket camera 414 captures an image of the socket 71 (step S350).

The extraction unit 441 of the image processing system 44 processes the image information captured by the socket camera 314 in step S310 and calculates the position and posture of the jig 60 in the image information on the basis of the position and array of the markers 62 formed in the jig 60. Based on this position and posture, the recognition unit 442 recognizes the relative position and posture P1 of the socket camera 414 with respect to the socket guide 73 (step S360).

Next, the extraction unit 441 of the image processing system 44 processes the image information captured by the device camera 434 in step S330 and extracts the position and posture of the jig 60 in the image information on the basis of the position and array of the marker 62 formed in the jig 60. Based on this position and posture, the recognition unit 442 recognizes the relative position and posture P2 of the device camera 434 with respect to the socket guide 73 (step S370).

Next, the extraction unit 441 of the image processing system 44 processes the image information captured by the socket camera 414 in step S350 and extracts the position and posture of the socket 71 in the image information on the basis of the positions and arrays of contact pins 72 provided at the socket 71. Based on this position and posture, the recognition unit 442 recognizes the relative position and posture P3 of the socket camera 414 with respect to the socket 71 (step S380).

Furthermore, the calculation unit 443 of the image processing system 44 calculates the offset amount ΔP of the socket guide 73 with respect to the socket 71 (=|P1-P3|) on the basis of the relative position P1 of the socket camera 414 with respect to the socket guide 73 recognized in step S360 and the relative position P3 of the socket camera 414 with respect to the socket 71 recognized in step S380 (step S390), and calculates the relative position P4 of the device camera 434 with respect to the socket 71 on the basis of this offset amount ΔP and the relative position P2 of the device camera 434 with respect to the socket guide 73 recognized in step S370 (step S400).

Figure 7:
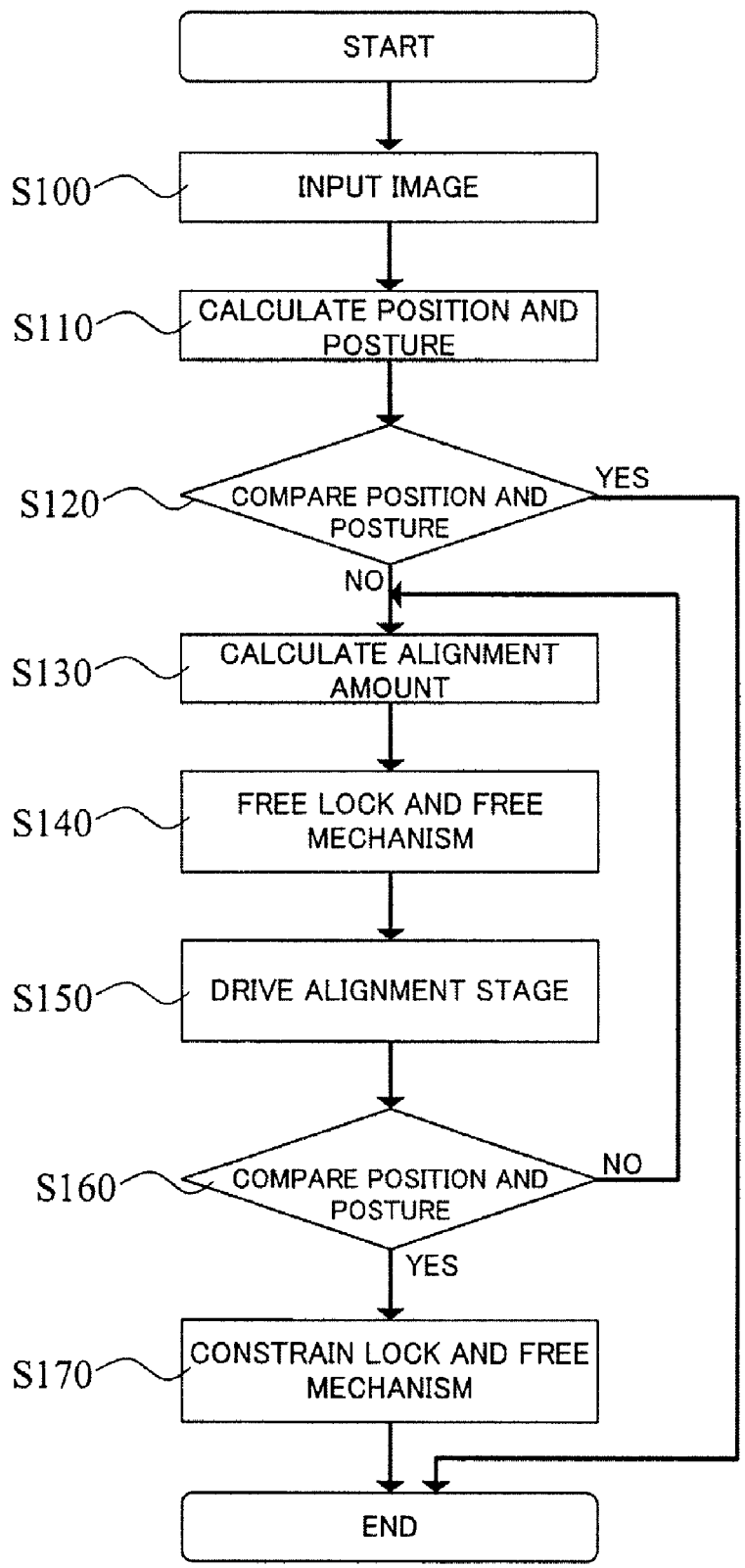
FIG. 7 is a flowchart showing the method of alignment of an IC device in an embodiment of the present invention.

Based on the relative position P4 of the device camera 434 with respect to the socket 71 calculated in this step S400, the position and posture of the socket 71 used at step S120 or S160 of FIG. 7 are set.

Note that, after the above calibration is completed, the device movement system 41 moves the jig 60 from the stage 431 of the alignment system 43 to a first buffer unit 33, the first buffer unit 33 moves the jig 60 from the region of the test unit 40 to the region of the loader unit 30, and then the first device conveyance system 31 returns the jig 60 to the storage location 34.

In the above way, the present embodiment adds the offset amount ΔP of the socket guide 73 with respect to the socket 71 to the relative position P2 of the device camera 434 with respect to the socket guide 73 so as to calculate the relative position of the device camera 434 with respect to the socket 71, so it is possible to calibrate the cameras 414 and 434 by a precision equal to the calibration based on the socket 71 itself as a reference.

Further, in the present embodiment, it is possible to perform the calibration automatically, so raising or lowering the temperature of the electronic device test apparatus at the time of calibration becomes unnecessary and the calibration can be completed in several minutes.

In the above embodiment, the explanation was given of performing the calibration according to the present embodiment at the time of changing the type of the IC devices, but the present invention is not particularly limited to this. For example, it is also possible to perform it in the following cases.

For example, it is also possible to automate the calibration so as to calibrate the relative position of the device camera even after raising and lowering the temperature of the electronic device test apparatus. Due to this, it becomes possible to perform high precision calibration considering also heat expansion etc.

Further, it is also possible to automatically perform the calibration every certain period such as with each start of work or every two days. Furthermore, for example, the calibration may be automatically performed when the alignment precision exceeds the reference value at the time of checking along with an earthquake etc.

Further, the present embodiment performs the calibration using a socket guide not depending on the type of IC device as a reference, so it is possible to improve the universality of the calibration jig 60.

Furthermore, in the present embodiment, offset of the socket camera arising due to heat expansion or vibration etc. is corrected. Below, referring to FIG. 14 to FIG. 15B, the method of correction of the relative position of the socket camera will be explained. Note that, the frequency of correction of the socket camera may be smaller than the frequency of the calibration explained with reference to FIG. 11 or the socket camera may be corrected with each calibration. Further, it is possible to perform the calibration, then correct the socket camera or the reverse.

Figure 15A:
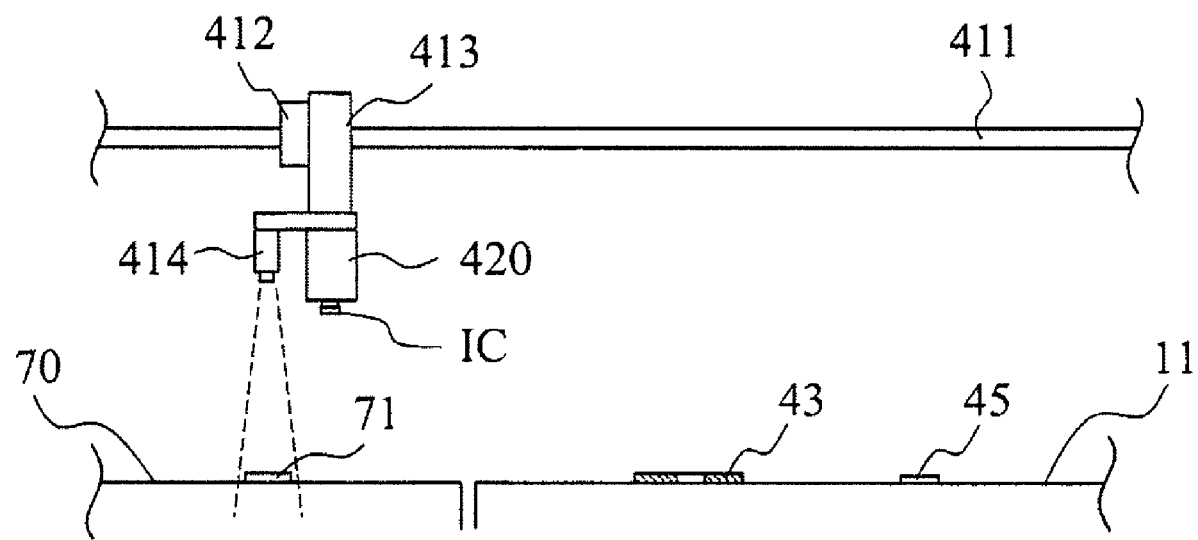
FIG. 15A is a schematic side view for explaining the method of correction of the relative position of a socket camera in an embodiment of the present invention, and shows the state of a socket camera capturing an image of the socket.

First, as shown in FIG. 15A, the movable rail 412 moves on the support rail 411 (step S500) so that the socket camera 414 positions above the socket 71, then the socket camera 414 captures an image of the socket 71 (step S510). Note that when the device camera is calibrated right before calibrating the socket camera, steps S500 and S510 may be replaced by steps S340 and S350 of FIG. 11.

Figure 15B:
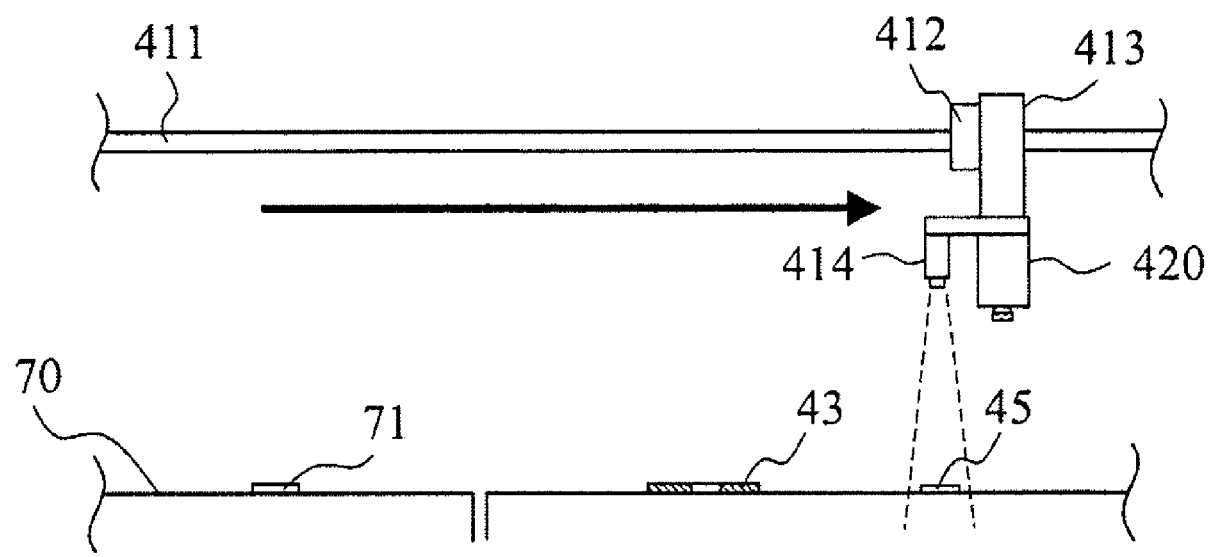
FIG. 15B is a schematic side view for explaining the method of correction of the relative position of a socket camera in an embodiment of the present invention, and shows the state of a socket camera capturing an image of the label.

Next, as shown in FIG. 15B, the movable rail 412 moves on the support rails 411 so that the socket camera 414 positions above the label 45 (step S520), then the socket camera 414 captures an image of the label 45 (step S530).

Next, the extraction unit 441 of the image processing system 44 processes the image information captured by the socket camera 414 in step S510 and extracts the position and posture of the socket 71 in the image information on the basis of the position and posture of the plurality of contact pins 72 of the socket 71 (see FIG. 3). Based on this position and posture, the recognition unit 442 recognizes the relative position and posture of the socket camera 414 with respect to the socket 71 (step S540). Note that when the device camera is calibrated right before calibrating the socket camera, this step S540 may be replaced by step S380 of FIG. 11.

Next, the extraction unit 441 of the image processing system 44 processes the image information captured by the socket camera 414 in step S530, and extracts the position and posture of the label 45 in the image information on the basis of the position and posture of the dot patterns 452 or 453 printed at the label 45. Based on this position and posture, the recognition unit 442 recognizes the relative position and posture of the socket camera 414 with respect to the label 45 (step S550).

Next, the calculation unit 443 of the image processing system 44 compares the relative position and posture of the socket camera 414 with respect to the label 45 recognized in step S550 with the reference relative position recognized in step S240 at the time of the reference calibration (see FIG. 8), and calculates the offset amount of the relative position recognized in step S550 with respect to the reference relative position (step S560).

Next, the correction unit 444 of the image processing system 44 subtracts the offset amount calculated in step S560 from the relative position and posture of the socket camera 414 with respect to the socket 71 recognized in step S540 so as to correct the relative position and posture of the socket camera 414 with respect to the socket 71 (step S570).

Based on the relative position and posture of the socket camera 414 with respect to the socket 71 corrected in this step S570, for example, the position and posture of the socket 71 used in step S120 or S160 of FIG. 7 and the movement amount of the contact arm 420 from the alignment stage 431 to the socket 71 by the device movement system 41 are corrected. Due to this correction, the positional offset of the socket camera 414 caused by heat expansion or vibration is eliminated from the relative position of the socket camera with respect to the socket recognized in step S540, so it is possible to prevent miscontact of the IC device and socket 71.

Note that the above-explained embodiments were described in order to facilitate understanding of the present invention and were not described in order to limit the present invention. Therefore, the elements disclosed in the above embodiments include all design modifications and equivalents falling under the technical scope of the present invention.

For example, in the above embodiment, the socket guide 73 was illustrated as the position for placement of the jig 60, but the present invention is not particularly limited to this so long as the socket camera 414 can capture an image in the handler 10. Further, in the above embodiment, as the fixing position of the label 45, the main base 11 of the handler 10 was shown, but the present invention is not particularly limited to this so long as it is a nonmoving part of the electronic device test apparatus. Furthermore, in the above embodiment, the explanation was given of the positioning pins 75 and the insertion holes 63 being used for positioning the socket guide 73 and the jig 60, but the present invention is not particularly limited to this.

The invention claimed is:

1. A calibration method of calibrating a relative position of a device image capturer with respect to a socket in an electronic device test apparatus, the electronic device test apparatus comprising:
 a socket image capturer configured to capture an image of the socket; and
 the device image capturer configured to capture an image of a device under test,
 wherein an aligner positions the device under test relative to the socket, and a mover brings the device under test into electrical contact with the socket to test the device under test,
 the calibration method comprising:
  placing a jig at a first predetermined position;
  capturing a first image of the jig placed at the first predetermined position by the socket image capturer;

moving the jig placed at the first predetermined position to the aligner by the mover;

capturing a second image of the jig positioned at the aligner by the device image capturer;

capturing a third image of the socket by the socket image capturer;

recognizing a first relative position of the socket image capturer with respect to the first predetermined position based on the first image;

recognizing a second relative position of the device image capturer with respect to the first predetermined position based on of the second image;

recognizing a third relative position of the socket image capturer with respect to the socket based on the third image;

calculating a first offset amount of the first predetermined position with respect to the socket based on the first relative position and the third relative position; and calculating a fourth relative position of the device image capturer with respect to the socket based on the second relative position and the first offset amount.

2. The calibration method as set forth in claim 1, wherein the first predetermined position includes a socket guide positioned above the socket.

3. The calibration method as set forth in claim 1, wherein the mover moves the jig from a second predetermined position to the first predetermined position for placement.

4. The calibration method as set forth in claim 3, further comprising:

returning the jig from the aligner to the second predetermined position by the mover.

5. The calibration method as set forth in claim 1, further comprising:

moving the socket image capturer above a label fixed at a predetermined fiducial position;

capturing a fourth image of the label by the socket image capturer;

recognizing a fifth relative position of the socket image capturer with respect to the label based on the fourth image;

calculating a second offset amount of the fifth relative position relative to a preset reference relative position of the socket image capturer with respect to the label; and correcting the third relative position based on the second offset amount.

6. The calibration method as set forth in claim 5, wherein the label is fixed at a nonmoving part of the electronic device test apparatus.

7. An electronic device test apparatus for bringing a device under test into electrical contact with a socket so as to test the device under test, the electronic device test apparatus comprising:

a socket image capturer configured to capture an image of the socket;

a device image capturer configured to capture an image of the device under test;

a mover to which the socket image capturer is attached and that is configured to move the device under test;

an aligner to which the device image capturer is provided and that is configured to position the device under test relative to the socket;

an image processor configured to process image information captured by the socket image capturer and the device image capturer; and a calibration jig configured to be placed at a first predetermined position, wherein the image processor has:

a first recognizer that recognizes a first relative position of the socket image capturer with respect to the first predetermined position based on a first image of the calibration jig placed at the first predetermined position and captured by the socket image capturer;

a second recognizer that recognizes a second relative position of the device image capturer with respect to the first predetermined position based on a second image of the calibration jig positioned at the aligner and captured by the device image capturer;

a third recognizer that recognizes a third relative position of the socket image capturer with respect to the socket based on a third image of the socket that is captured by the socket image capturer;

a first calculator that calculates a first offset amount of the first predetermined position with respect to the socket based on the first relative position and the third relative position; and a second calculator that calculates a fourth relative position of the device image capturer with respect to the socket based on the second relative position and the first offset amount.

8. The electronic device test apparatus as set forth in claim 7, wherein the first predetermined position includes a socket guide positioned above the socket.

9. The electronic device test apparatus as set forth in claim 7, further comprising:

a storage configured to store the calibration jig.

10. The electronic device test apparatus as set forth in claim 9, further comprising:

a conveyer configured to one of carry the device under test before testing into an operating range of the mover and carry the device under test after testing out of the operating range of the mover, wherein the mover and conveyer move the calibration jig from the storage to the first predetermined position.

11. The electronic device test apparatus as set forth in claim 10, wherein the mover and conveyer move the calibration jig from the aligner to the storage.

12. The electronic device test apparatus as set forth in claim 7, wherein the calibration jig comprises:

a base member located at the first predetermined position; and markers provided at least at two points on each of two main surfaces of the base member so that a position and a posture of the calibration jig is recognizable by the socket image capturer and the device image capturer.

13. The electronic device test apparatus as set forth in claim 12, wherein the markers are through holes passing through the base member.

14. The electronic device test apparatus as set forth in claim 7, further comprising:

a label fixed at a predetermined fiducial position so as to be capturable by the socket image capturer, wherein the image processor includes:

a fourth recognizer that recognizes a fifth relative position of the socket image capturer with respect to the label based on a fourth image of the label that is captured by the socket image capturer;

a third calculator that calculates a second offset amount of the fifth relative position relative to a preset reference relative position of the socket image capturer with respect to the label; and a corrector that corrects the third relative position based on the second offset amount.

15. The electronic device test apparatus as set forth in claim 14, wherein the label is fixed to a nonmoving part of the electronic device test apparatus.

16. A calibration jig used for calibrating a relative position of a device image capturer with respect to a socket in an electronic device test apparatus, the electronic device test apparatus comprising:
- a socket image capturer configured to capture an image of the socket; and
- the device image capturer configured to capture an image of a device under test,
- wherein an aligner positions the device under test relative to the socket, and a mover brings the device under test into electrical contact with the socket to test the device under test, the calibration jig comprising:
- a base member located at a first predetermined position of the electronic device test apparatus; and
- markers provided at least at two points on each of two main surfaces of the base member so that a position and a posture of the calibration jig is recognizable by the socket image capturer and the device image capturer.

17. The calibration jig as set forth in claim 16, wherein the first predetermined position includes a socket guide positioned above the socket.

18. The calibration jig as set forth in claim 16, wherein the markers are through holes passing through the base member.

* * * * *